(12) United States Patent
Wang

(10) Patent No.: US 9,691,587 B2
(45) Date of Patent: Jun. 27, 2017

(54) DIMENSION MEASUREMENT APPARATUS CALIBRATION STANDARD AND METHOD FOR FORMING THE SAME

(71) Applicant: Taiwan Semiconductor Manufacturing Co., Ltd, Hsin-Chu (TW)

(72) Inventor: Shiang-Bau Wang, Pingzchen (TW)

(73) Assignee: TAIWAN SEMICONDUCTOR MANUFACTURING CO., LTD., Hsin-Chu (TW)

(*) Notice: Subject to any disclaimer, the term of this patent is extended or adjusted under 35 U.S.C. 154(b) by 226 days.

(21) Appl. No.: 14/319,071

(22) Filed: Jun. 30, 2014

(65) Prior Publication Data
US 2015/0380209 A1 Dec. 31, 2015

(51) Int. Cl.
*H01L 21/02* (2006.01)
*H01L 21/311* (2006.01)
*H01J 37/26* (2006.01)
*H01L 21/66* (2006.01)

(52) U.S. Cl.
CPC ............ *H01J 37/261* (2013.01); *H01L 22/30* (2013.01); *H01L 22/12* (2013.01)

(58) Field of Classification Search
None
See application file for complete search history.

(56) References Cited

U.S. PATENT DOCUMENTS

| | | | | |
|---|---|---|---|---|
| 6,325,676 B1* | 12/2001 | Jung | ................ | H01L 21/31055 216/67 |
| 8,071,484 B2* | 12/2011 | Kim | ................ | H01L 21/0337 216/13 |
| 8,398,874 B2* | 3/2013 | Kwon | ................ | H01L 21/0337 216/41 |
| 8,598,041 B2* | 12/2013 | Sant | ................ | H01L 21/3086 216/41 |
| 8,764,999 B2* | 7/2014 | Dunn | ................ | H01L 21/0274 216/41 |
| 8,796,156 B2* | 8/2014 | Shieh | ................ | H01L 21/823431 438/706 |
| 8,969,206 B1* | 3/2015 | Sel | ................ | H01L 21/32139 216/46 |
| 2007/0054458 A1* | 3/2007 | Wang | ................ | H01L 21/0206 438/305 |

* cited by examiner

*Primary Examiner* — Shamim Ahmed
(74) *Attorney, Agent, or Firm* — McClure, Qualey & Rodack, LLP

(57) ABSTRACT

A method for forming a dimension measurement apparatus calibration standard over a substrate is provided. The method includes forming strip structures over the substrate. The method includes depositing a calibration material layer over the substrate and the strip structures. The calibration material layer and the strip structures are made of different materials. The method includes removing the calibration material layer over top surfaces of the strip structures to expose the strip structures. The method includes removing the strip structures. The calibration material layer remaining over sidewalls of the strip structures forms linear calibration structures.

20 Claims, 13 Drawing Sheets

DIMENSION MEASUREMENT APPARATUS CALIBRATION STANDARD AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
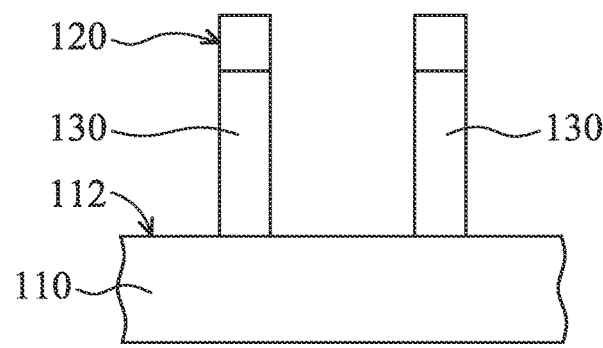
FIGS. 1A-1F are cross-sectional views of various stages of a process for forming a dimension measurement apparatus calibration standard over a substrate, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1F are cross-sectional views of various stages of a process for forming a dimension measurement apparatus calibration standard over a substrate, in accordance with some embodiments. FIG. 2A is a partial top view of the patterned mask layer and the substrate of FIG. 1A. FIG. 2B is a partial top view of the dimension measurement apparatus calibration standard and the substrate of FIG. 1F.

Figure 2A:
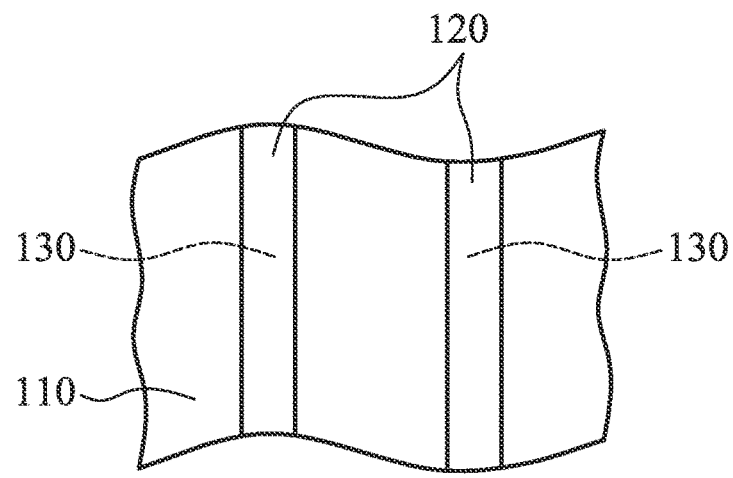
FIG. 2A is a partial top view of the patterned mask layer and the substrate of FIG. 1A.
Figure 2B:
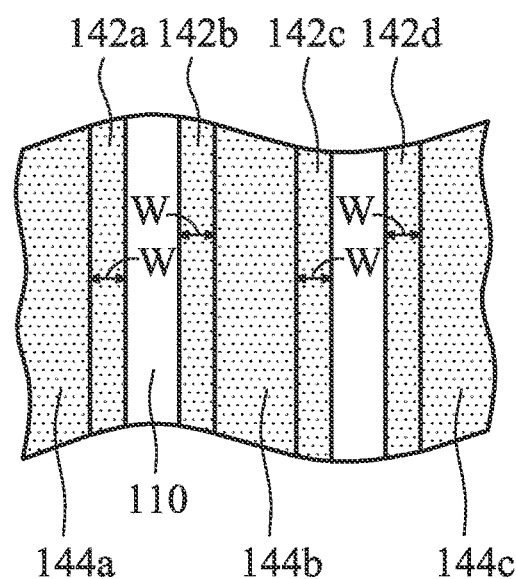
FIG. 2B is a partial top view of the dimension measurement apparatus calibration standard and the substrate of FIG. 1F.

As shown in FIG. 1A, a substrate 110 is provided. The substrate 110 has a surface 112, in accordance with some embodiments. In some embodiments, the surface 112 is a planar surface. In some embodiments, the substrate 110 is a wafer. In some embodiments, the substrate 110 is made of an elementary semiconductor material including silicon or germanium in a single crystal, polycrystal, or amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe, GaAsP, or a combination thereof. The substrate 110 may also include a multi-layer semiconductor substrate, a semiconductor-on-insulator (SOI) substrate, or a combination thereof. The SOI substrate includes, for example, a silicon-on-insulator substrate or a germanium-on-insulator substrate.

Thereafter, a material layer (not shown) is formed over the surface 112 of the substrate 110, in accordance with some embodiments. The material layer includes, for example, polysilicon, tungsten, titanium nitride, or tantalum nitride. The material layer is formed by, for example, a sputtering process, a physical vapor deposition process, or a chemical vapor deposition process.

Afterwards, as shown in FIGS. 1A and 2A, a patterned mask layer 120 is formed over the material layer, in accordance with some embodiments. The patterned mask layer 120 includes, for example, oxides. Thereafter, an etching process is performed to remove the material layer exposed by the patterned mask layer 120, in accordance with some embodiments. The remaining material layer forms strip structures 130, in accordance with some embodiments. It should be noted that, for the sake of simplicity, FIGS. 1A-1E show only two strip structures 130 for illustration, but the invention is not limited thereto. For example, the number of the strip structures 130 may be three or more than three.

Figure 1B:
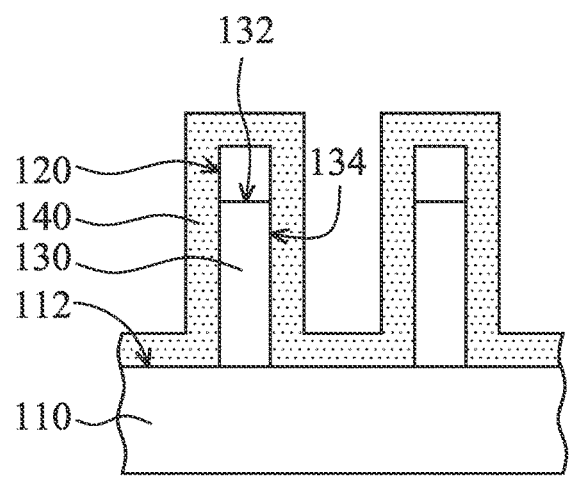

Thereafter, as shown in FIG. 1B, a calibration material layer 140 is deposited over the surface 112 of the substrate 110 and top surfaces 132 and sidewalls 134 of the strip structures 130, in accordance with some embodiments. In some embodiments, the calibration material layer 140 is conformally deposited over the surface 112 of the substrate 110 and the sidewalls 134 of the strip structures 130, in accordance with some embodiments.

The calibration material layer 140 and the strip structures 130 are made of different materials, in accordance with some embodiments. The calibration material layer 140 includes silicon, silicon nitride, silicon carbon nitride, silicon carbon oxide nitride (SiCON), silicon carbide (SiC), silicon oxide, silicon oxide nitride (SiON), aluminum, titanium nitride, tantalum nitride, tungsten, or titanium, in accordance with some embodiments.

The calibration material layer 140 is deposited by a chemical vapor deposition (CVD) process or a physical vapor deposition (PVD) process, in accordance with some embodiments. In some embodiments, the calibration material layer 140 is deposited by an atomic layer deposition process, a plasma enhanced atomic layer deposition process, a low-pressure chemical vapor deposition process, a plasma enhanced chemical vapor deposition process, or a hybrid physical-chemical vapor deposition process.

Figure 1C:
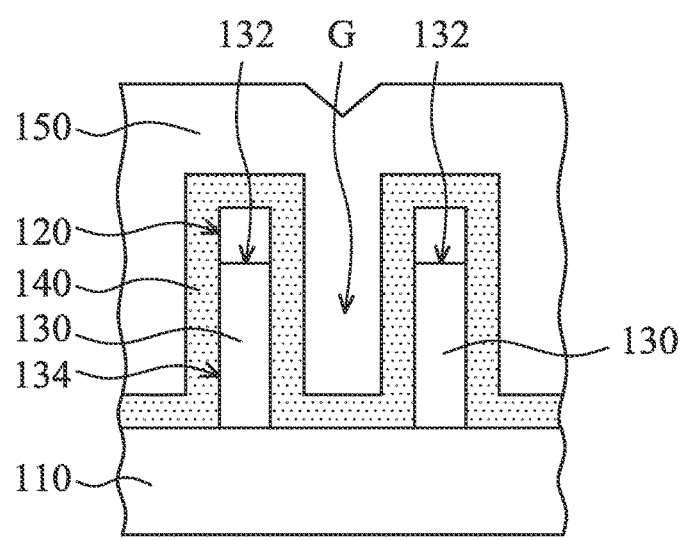

Thereafter, as shown in FIG. 1C, a cover layer 150 is formed over the calibration material layer 140, in accordance with some embodiments. The cover layer 150 fills gaps G between the strip structures 130 to cover the calibration material layer 140 over the sidewalls 134 of the strip structures 130, in accordance with some embodiments. The cover layer 150 includes photoresist materials or other suitable materials, which are different from the materials of the calibration material layer 140 and the strip structures 130. The cover layer 150 is formed by a coating process or another suitable process.

Figure 1D:
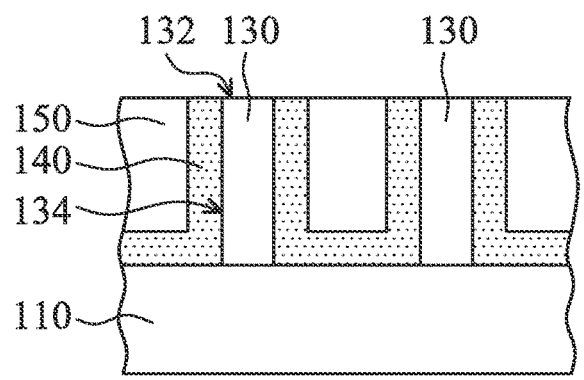

Afterwards, as shown in FIG. 1D, a top portion of the cover layer 150, the calibration material layer 140 over the top surfaces 132, and the patterned mask layer 120 are removed, in accordance with some embodiments. After the removal process, the strip structures 130 are exposed. The removal process includes a dry etching process or another suitable removal process, which removes the cover layer 150, the calibration material layer 140, and the patterned mask layer 120 at substantially the same rate. In some embodiments, the removal process further removes a portion of the strip structures 130.

Figure 1E:
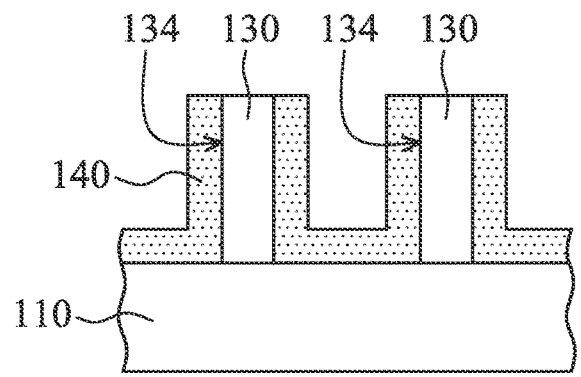
Figure 1F:
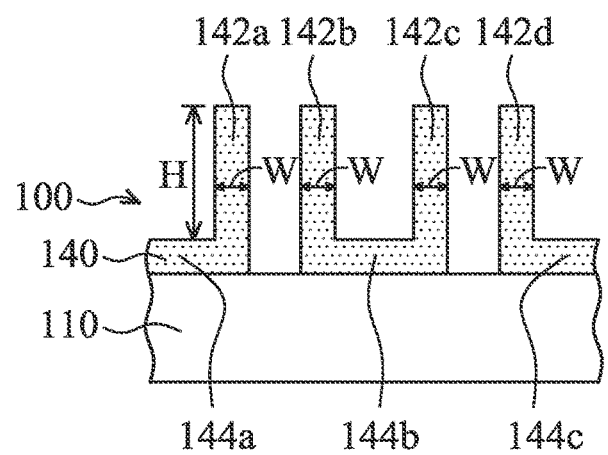

Thereafter, as shown in FIG. 1E, the cover layer 150 is removed, in accordance with some embodiments. The removal process includes a photoresist stripping process or another suitable removal process. Afterwards, as shown in FIGS. 1F and 2B, the strip structures 130 are removed. The removal process includes, for example, a dry etching process, a wet etching process, or a combination thereof.

As shown in FIGS. 1E, 1F, and 2B, the calibration material layer 140 remaining over the sidewalls 134 of the strip structures 130 forms linear calibration structures 142a, 142b, 142c, and 142d, in accordance with some embodiments. In some embodiments, a dimension measurement apparatus calibration standard 100 includes the remaining calibration material layer 140. The dimension measurement apparatus calibration standard 100 includes, for example, a critical dimension scanning electron microscope (CD-SEM) calibration standard.

The dimension measurement apparatus calibration standard 100 includes the linear calibration structures 142a, 142b, 142c, and 142d and connection structures 144a, 144b, and 144c, in accordance with some embodiments. In some embodiments, the linear calibration structures 142a, 142b, 142c, and 142d are parallel to each other.

The connection structure 144b connects the linear calibration structures 142b and 142c, in accordance with some embodiments. The connection structure 144a connects the linear calibration structure 142a and another linear calibration structure (not shown), in accordance with some embodiments. The connection structure 144c connects the linear calibration structure 142d and another linear calibration structure (not shown), in accordance with some embodiments.

In some embodiments, the connection structure 144a, 144b, or 144c is thinner than the linear calibration structure 142a, 142b, 142c, or 142d. A height H is equal to the thickness difference between the linear calibration structure 142a, 142b, 142c, or 142d and the connection structure 144a, 144b, or 144c. In some embodiments, the height H ranges from about 10 nm to about 200 nm. The linear calibration structures 142a, 142b, 142c, and 142d are kept at a proper height in order to provide sufficient contrast to make calibrating the CD-SEM easier and more accurate.

Since the calibration material layer 140 is formed by a deposition process, the calibration material layer 140 has a substantially uniform thickness. Therefore, the linear calibration structures 142a, 142b, 142c, and 142d may have substantially similar line widths W. In some embodiments, the line width W ranging from about 5 nm to about 50 nm. In some embodiments, a line width uniformity (3-sigma) of the linear calibration structures 142a, 142b, 142c, and 142d ranges from about 0.05 nm to about 1 nm.

Since critical dimensions (e.g., line widths or thicknesses) of features (e.g., metal lines or films) of current semiconductor devices are small, a critical dimension scanning electron microscope (CD-SEM) is used to measure the critical dimensions. However, the measured value of the critical dimension may fluctuate from tool to tool due to CD-SEM tools having tool offsets that vary from tool to tool.

Therefore, a calibration standard may be used to calibrate the CD-SEM tools for tool-to-tool matching. The different CD-SEM tools need to measure different features (e.g., linear calibration structures) of the calibration standard, respectively, to avoid a charging effect. Therefore, the uniformity of the critical dimensions (e.g., line widths) of the features of the calibration standard is important.

Since the linear calibration structures 142a, 142b, 142c, and 142d are not formed by a photolithography process and an etching process, the uniformity of the line widths W is not affected by the photolithography process and the etching process. As a result, the uniformity of the line widths W is improved, which benefits tool-to-tool matching and therefore improves the accuracy of the measured values of the critical dimensions of semiconductor devices.

In some embodiments, the substrate 110 is a calibration wafer. In some other embodiments, the substrate is an in-line wafer, and a dimension measurement apparatus calibration standard and semiconductor devices (not shown) are formed over the substrate simultaneously. The detailed process performed over the in-line wafer is illustrated as follows.

FIGS. 3A-3F are cross-sectional views of various stages of a process for forming a dimension measurement apparatus calibration standard over a substrate, in accordance with some embodiments. It should be noted that the process of FIGS. 3A-3F is similar to the process of FIGS. 1A-1F, except that FIGS. 3A-3F show that a dimension measurement apparatus calibration standard and semiconductor devices are formed over a substrate simultaneously.

Figure 3A:
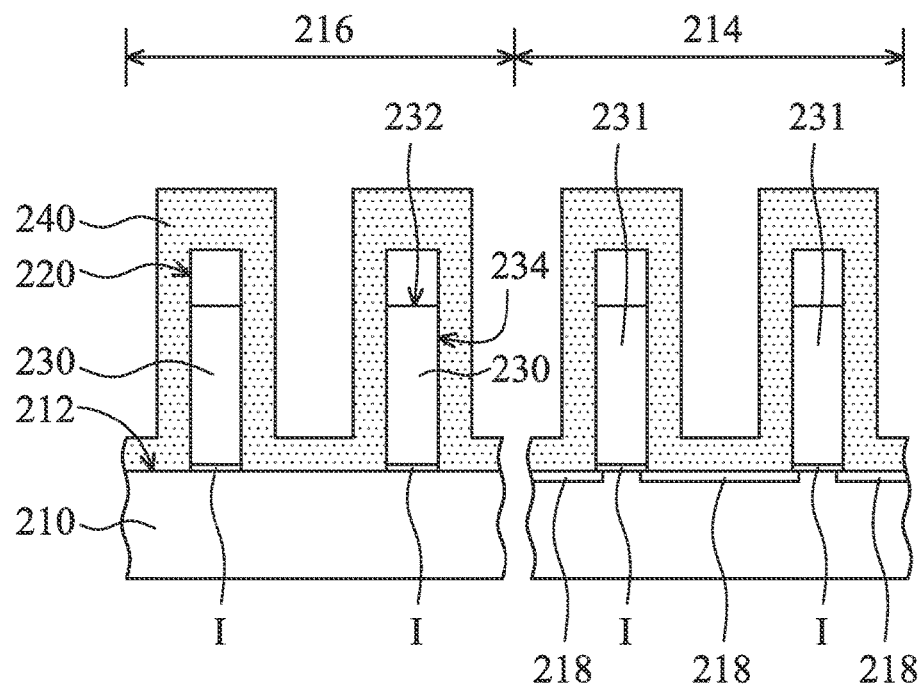
FIGS. 3A-3F are cross-sectional views of various stages of a process for forming a dimension measurement apparatus calibration standard over a substrate, in accordance with some embodiments.

As shown in FIG. 3A, a substrate 210 is provided. The substrate 210 has a surface 212, in accordance with some embodiments. In some embodiments, the surface 212 is a planar surface. In some embodiments, the substrate 210 is an in-line wafer. The substrate 210 has an active region 214 and a calibration region 216, in accordance with some embodiments.

Thereafter, a material layer (not shown) is formed over the surface 212 of the substrate 210, in accordance with some embodiments. The material layer includes, for example, polysilicon. The material layer is formed by, for example, a sputtering process. Afterwards, a patterned mask layer 220 is formed over the material layer, in accordance with some embodiments. The patterned mask layer 220 includes, for example, oxides.

Thereafter, an etching process is performed to remove the material layer exposed by the patterned mask layer 220, in accordance with some embodiments. The remaining material layer forms gates 231 in the active region 214 and strip structures 230 in the calibration region 216, in accordance with some embodiments. In some embodiments, a dielectric layer I is formed between the gates 231 and the substrate 210. In some embodiments, the dielectric layer I is further formed between the strip structures 230 and the substrate 210.

Thereafter, the calibration region 216 is covered by a mask layer (not shown), and lightly doped regions 218 are formed in the active region 214, in accordance with some embodiments. The lightly doped regions 218 are formed by, for example, an ion implantation process. The ion implantation process may use the gates 231 as a mask, and the lightly doped regions 218 are at two opposite sides of each of the gates 231.

The lightly doped regions 218 may be lightly doped source regions and lightly doped drain (LDD) regions. The dopants used in the ion implantation process may include boron or phosphorous. Thereafter, the mask layer covering the calibration region 216 is removed, in accordance with some embodiments.

Afterwards, a calibration material layer 240 is deposited over the surface 212 of the substrate 210, top surfaces 232 and sidewalls 234 of the strip structures 230, and the gates 231, in accordance with some embodiments. The calibration material layer 240 and the strip structures 230 are made of different materials, in accordance with some embodiments.

The calibration material layer 240 includes insulating materials. The insulating materials include, for example, silicon nitride, silicon carbon nitride, silicon carbon oxide nitride (SiCON), silicon carbide (SiC), silicon oxide, or silicon oxide nitride (SiON), in accordance with some embodiments. The deposition method of the calibration material layer 240 is similar to that of the calibration material layer 140, in accordance with some embodiments.

Figure 3B:
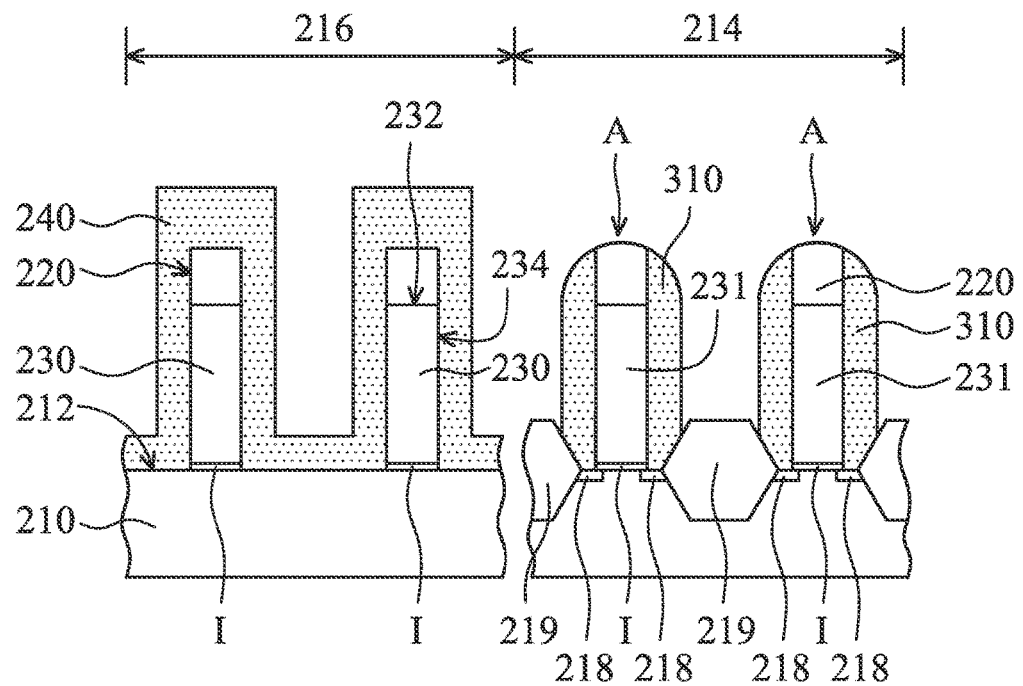

Thereafter, the calibration region 216 is covered by a mask layer (not shown), and an anisotropic etching process (e.g. a dry etching process) is performed to remove a portion of the calibration material layer 240 in the active region 214. Afterwards, the mask layer is removed. As shown in FIG. 3B, the remaining calibration material layer 240 over the sidewalls of the patterned mask layer 220, the gate 231, and the dielectric layer I forms spacer layers 310. The spacer layers 310 may be configured to electrically isolate the gates 231 from other devices.

Thereafter, the calibration region 216 is covered by a mask layer (not shown), and source/drain stressors 219 are formed in the active regions 214 and at two opposite sides of each of the gates 231. Afterwards, the mask layer is removed. The formation method of the source/drain stressors 219 includes, for example, an etching process for removing a portion of the substrate 210 and a selective epitaxial growth (SEG) process.

Depending on the desired type of the resulting MOS device, either source/drain stressors applying a compressive stress to the channel region (such as SiGe stressors) or source/drain stressors applying a tensile stress to the channel region (such as SiC stressors) are formed.

In this step, transistors A are formed in the active regions 214. Each of the transistors A includes a gate 231 and two source/drain stressors 219 at two opposite sides of the gate 231, in accordance with some embodiments. In some embodiments, the transistors A are electrically connected in series with each other.

Figure 3C:
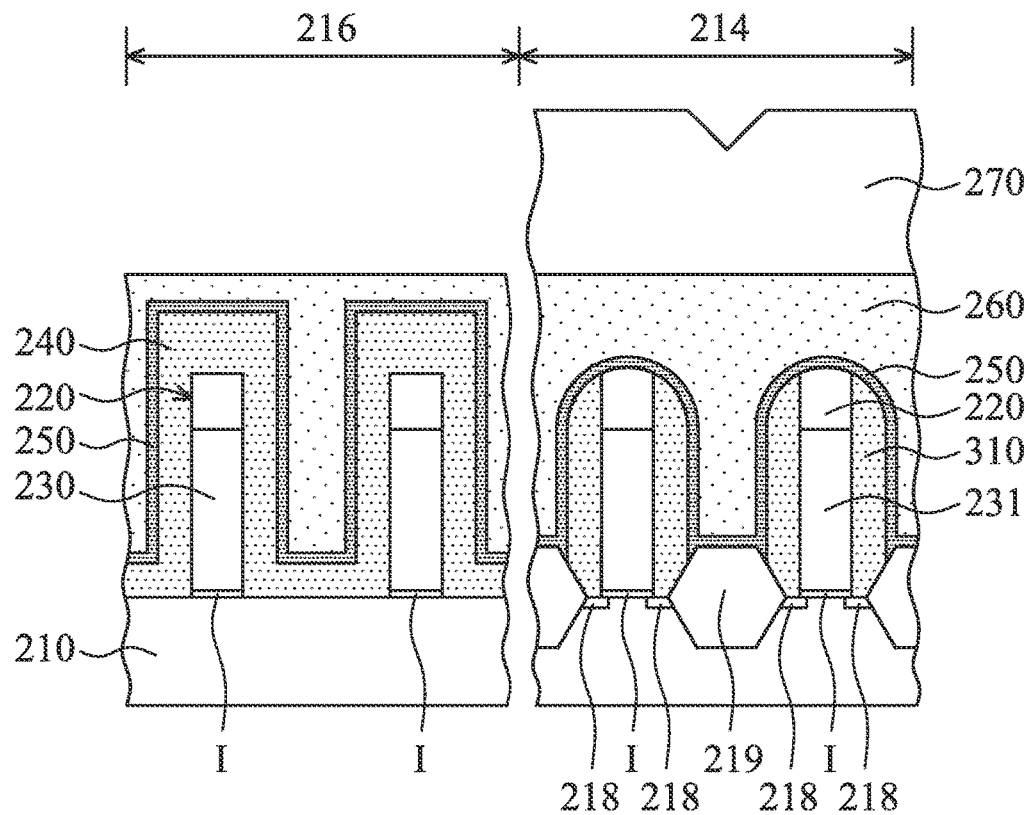

Afterwards, as shown in FIG. 3C, an etch stop layer 250 is deposited over the calibration material layer 240, the spacer layer 310, and the patterned mask layer 220, in accordance with some embodiments. The etch stop layer 250 includes, for example, silicon nitride.

Thereafter, a bottom layer 260 (also referred to as a bottom anti-reflective coating layer) is deposited over the etch stop layer 250, in accordance with some embodiments. The bottom layer 260 includes, for example, organic materials. Afterwards, a mask layer 270 is formed over the active region 214, in accordance with some embodiments. In some embodiments, the mask layer 270 includes a photoresist layer.

Figure 3D:
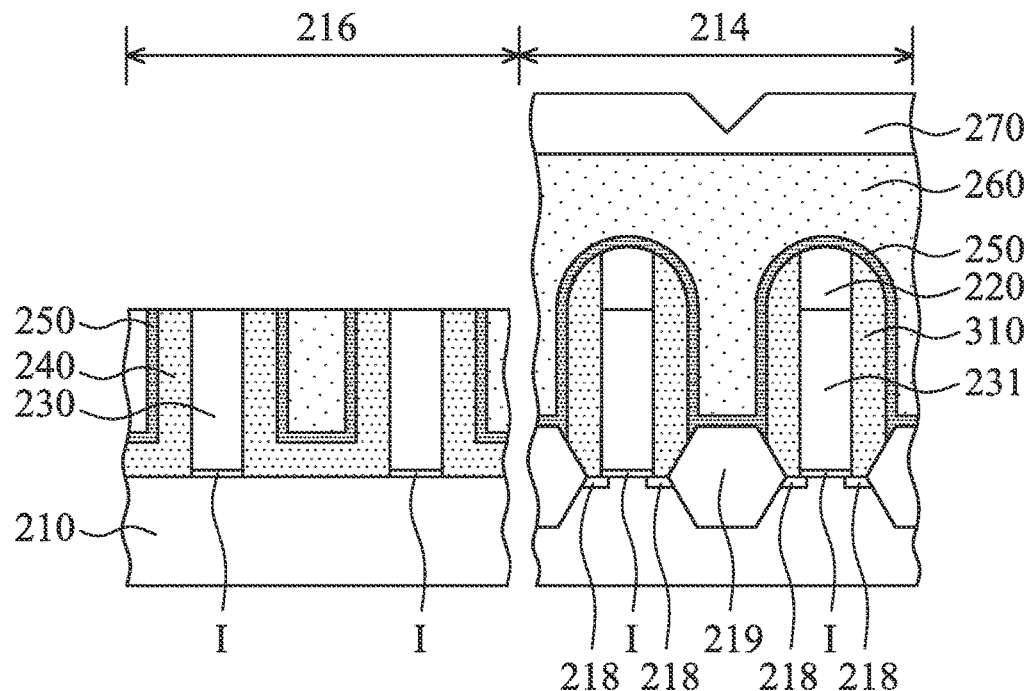

Thereafter, as shown in FIG. 3D, top portions of the bottom layer 260, the etch stop layer 250, the calibration material layer 240, and the patterned mask layer 220 in the calibration region 216 and a top portion of the mask layer 270 are removed, in accordance with some embodiments. The removal process includes, for example, a dry etching process.

Figure 3E:
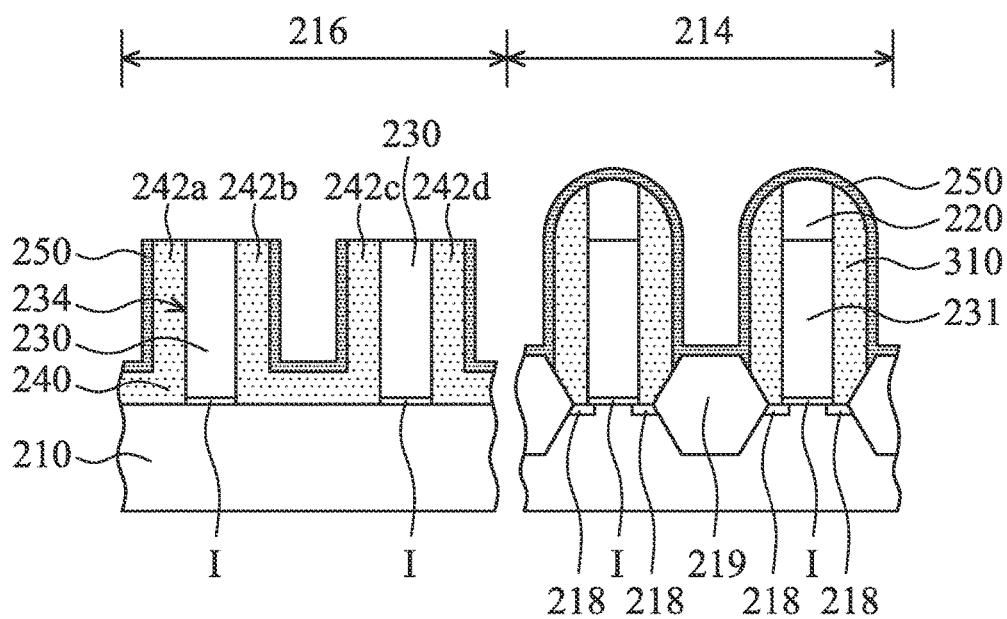
Figure 3F:
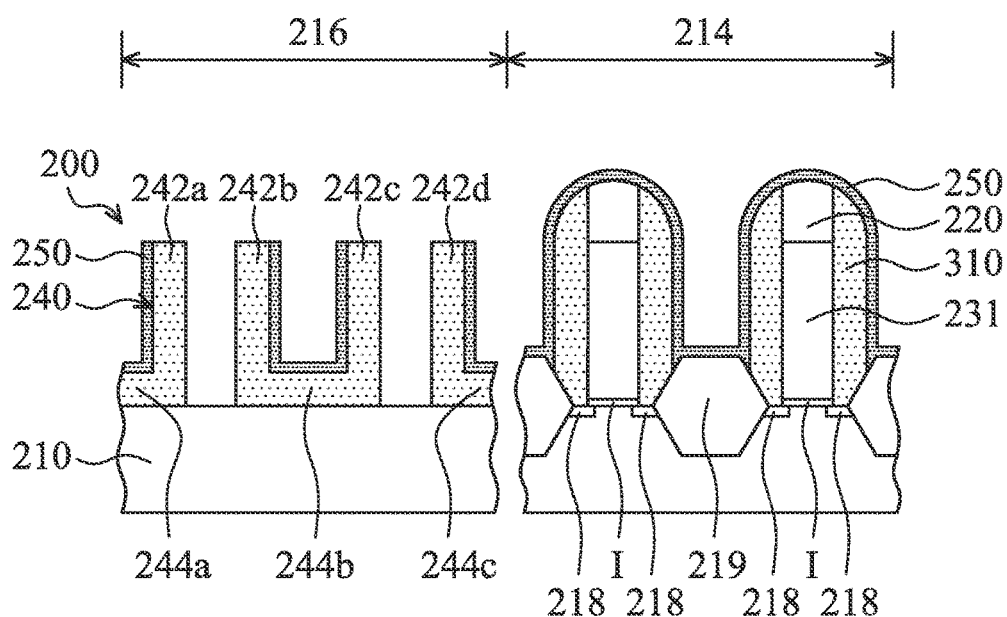

As shown in FIG. 3E, the bottom layer 260 and the mask layer 270 are removed, in accordance with some embodiments. As shown in FIG. 3F, the strip structures 230 are removed. The removal process includes, for example, a dry etching process, a wet etching process, or a combination thereof.

As shown in FIGS. 3E and 3F, the calibration material layer 240 remaining over the sidewalls 234 of the strip structures 230 forms linear calibration structures 242a, 242b, 242c, and 242d, in accordance with some embodiments. In some embodiments, a dimension measurement apparatus calibration standard 200 includes the remaining calibration material layer 240 in the calibration region 216.

The dimension measurement apparatus calibration standard 200 includes the linear calibration structures 242a, 242b, 242c, and 242d and connection structures 244a, 244b, and 244c, in accordance with some embodiments. The connection structure 244b connects the linear calibration structures 242b and 242c, in accordance with some embodiments.

The connection structure 244a connects the linear calibration structure 242a and another linear calibration structure (not shown), in accordance with some embodiments. The connection structure 244c connects the linear calibration structure 242d and another linear calibration structure (not shown), in accordance with some embodiments. In some embodiments, the dimension measurement apparatus calibration standard 200 further includes the etch stop layer 250 over the remaining calibration material layer 240 in the calibration region 216.

Since the dimension measurement apparatus calibration standard 200 is formed over the in-line wafer, an in-line tool calibration procedure may be performed, in accordance with some embodiments. Therefore, an off-line tool calibration procedure is not needed, which may shorten the time consumed by the tool calibration, in accordance with some embodiments.

FIGS. 4A-4F are cross-sectional views of various stages of a process for forming a dimension measurement apparatus calibration standard over a substrate, in accordance with some embodiments. FIG. 5 is a top view of the dimension measurement apparatus calibration standard, the etch stop layer, and the substrate of FIG. 4F, in accordance with some embodiments.

Figure 4A:
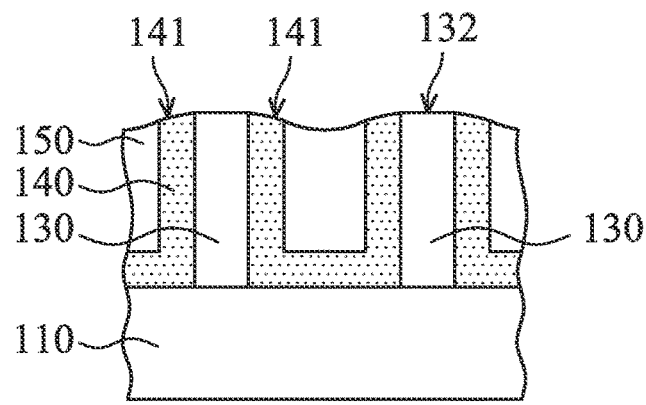
FIGS. 4A-4F are cross-sectional views of various stages of a process for forming a dimension measurement apparatus calibration standard over a substrate, in accordance with some embodiments.
Figure 5:
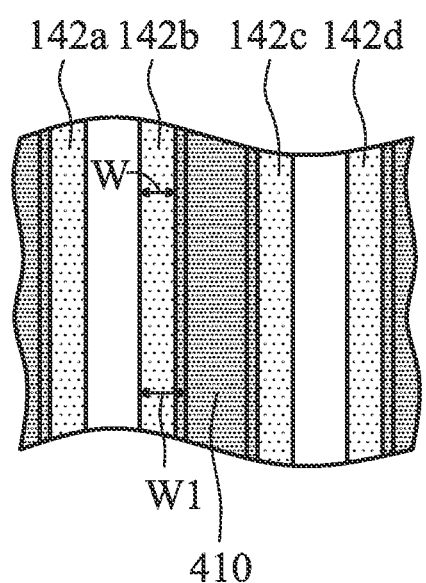
FIG. 5 is a partial top view of the dimension measurement apparatus calibration standard, the etch stop layer, and the substrate of FIG. 4F, in accordance with some embodiments.

After the stage of FIG. 1C, as shown in FIG. 4A, a top portion of the cover layer 150, the calibration material layer 140 over the top surfaces 132, and the patterned mask layer 120 are removed, in accordance with some embodiments. After the removal process, the strip structures 130 are exposed.

The removal process includes, for example, a dry etching process. The removal rates of the cover layer 150 and the calibration material layer 140 may be different due to the fact that the cover layer 150 and the calibration material layer 140 are made of different materials. Therefore, a top surface 141 of the calibration material layer 140 is a curved surface, in accordance with some embodiments.

Figure 4B:
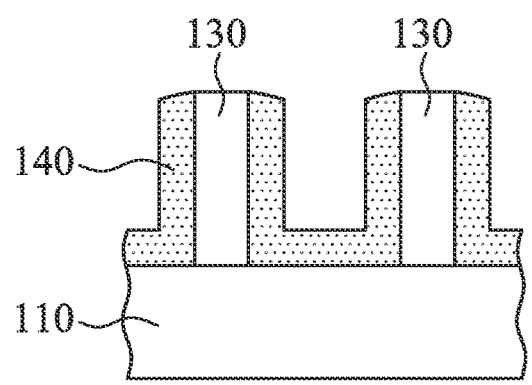
Figure 4C:
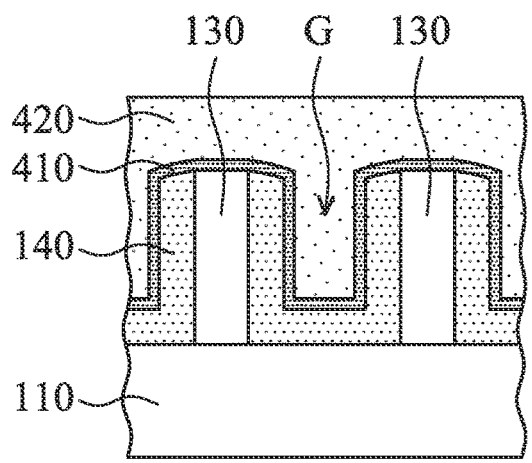

As shown in FIG. 4B, the cover layer 150 is removed, in accordance with some embodiments. As shown in FIG. 4C, an etch stop layer 410 is deposited over the calibration material layer 140 and the strip structures 130, in accordance with some embodiments. The etch stop layer 410 includes, for example, silicon nitride.

Thereafter, a filling layer 420 is formed over the calibration material layer 140 and the strip structures 130 to fill gaps G between the strip structures 130, in accordance with some embodiments. In some embodiments, the filling layer 420 is formed over the etch stop layer 410. The filling layer 420 includes dielectric materials, such as silicon oxides. The filling layer 420 is formed by, for example, a CVD process.

Figure 4D:
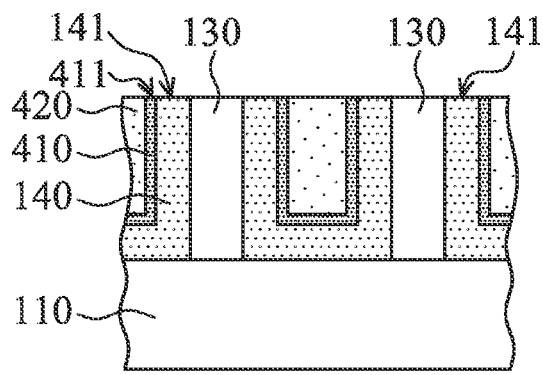

As shown in FIG. 4D, a planarization process is performed to remove a portion of the filling layer 420, top portions of the etch stop layer 410, top portions of the calibration material layer 140, and top portions of the strip structures 130, in accordance with some embodiments. The planarization process includes, for example, a chemical-mechanical polishing process.

The planarization process may have a first step and a second step, in accordance with some embodiments. The first step and the second step use different slurries. The first step includes removing a portion of the filling layer 420 until exposing the etch stop layer 410. The second step includes removing the top portions of the etch stop layer 410, the top portions of the calibration material layer 140, and the top portions of the strip structures 130. After the planarization process, the strip structures 130 are exposed.

Figure 4E:
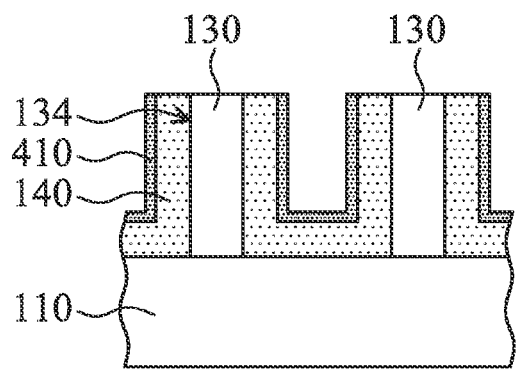

As shown in FIG. 4E, the filling layer 420 is removed. The removal process includes, for example, a wet etching process. In some other embodiments (not shown), the etch stop layer 410 is removed by a wet etch process.

Figure 4F:
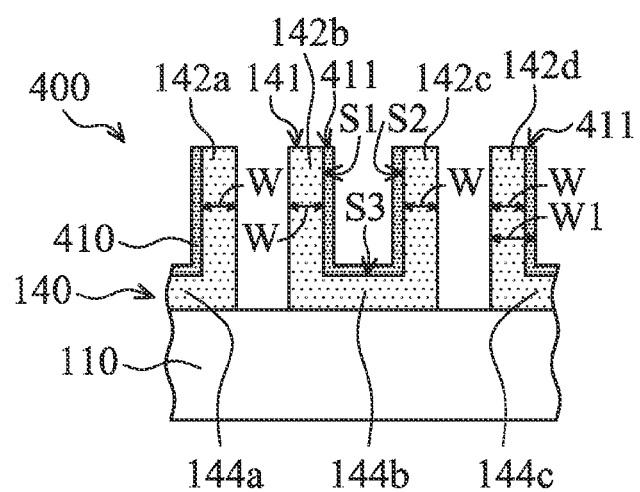

As shown in FIG. 4F, the strip structures 130 are removed. The removal process is similar to those of the strip structures 130 of FIG. 1E. As shown in FIGS. 4E, 4F, and 5, the calibration material layer 140 remaining over the sidewalls 134 of the strip structures 130 forms linear calibration structures 142a, 142b, 142c, and 142d, in accordance with some embodiments. In some embodiments, a dimension measurement apparatus calibration standard 400 includes the remaining calibration material layer 140. In some embodiments, the dimension measurement apparatus calibration standard 400 further includes the etch stop layer 410.

The remaining calibration material layer 140 is substantially similar to the remaining calibration material layer 140 of FIG. 1F. It should be noted that after the planarization process, the top surface 141 of the calibration material layer 140 becomes a planar surface, which helps to improve the accuracy of the measured values of the line widths W of the linear calibration structures 142a, 142b, 142c, and 142d.

In some embodiments, after the planarization process, the top surface 411 of the etch stop layer 410 also becomes a planar surface, which helps to improve the accuracy of the measured value of a line width W1 of a linear structure constituted by the linear calibration structure 142a, 142b, 142c, or 142d and the etch stop layer 410. In some embodiments, the top surface 411 of the etch stop layer 410 is coplanar with the top surface 141 of the calibration material layer 140.

In some embodiments, the etch stop layer 410 covers a sidewall S1 of the linear calibration structure 142b, a sidewall S2 of the linear calibration structure 142c, and a top surface S3 of the connection structure 144b. The sidewalls S1 and S2 face each other.

In some embodiments, the substrate 110 is a calibration wafer. In some other embodiments, the substrate is an in-line wafer, and a dimension measurement apparatus calibration standard and semiconductor devices (not shown) are formed over the substrate simultaneously. The detailed process performed over the in-line wafer is illustrated as follows.

FIGS. 6A-6H are cross-sectional views of various stages of a process for forming a dimension measurement apparatus calibration standard over a substrate, in accordance with some embodiments. It should be noted that the process of FIGS. 6A-6H is similar to the process of FIGS. 4A-4F, except that FIGS. 6A-6H shows that a dimension measurement apparatus calibration standard and semiconductor devices are formed over a substrate simultaneously.

Figure 6A:
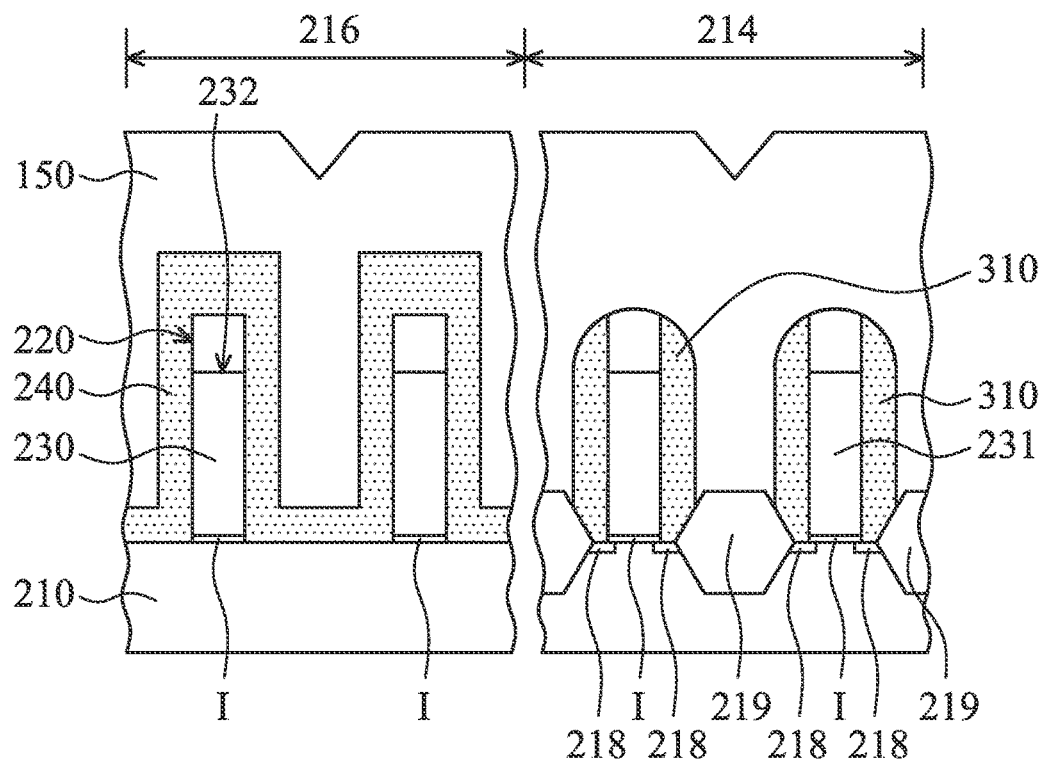
FIGS. 6A-6H are cross-sectional views of various stages of a process for forming a dimension measurement apparatus calibration standard over a substrate, in accordance with some embodiments.

After the stage illustrated in FIG. 3B, as shown in FIG. 6A, a cover layer 150 is formed over the substrate 210 to cover the calibration material layer 240, the spacer layer 310, and the patterned mask layer 220, in accordance with some embodiments. In some embodiments, the cover layer 150 includes a photoresist layer.

Figure 6B:
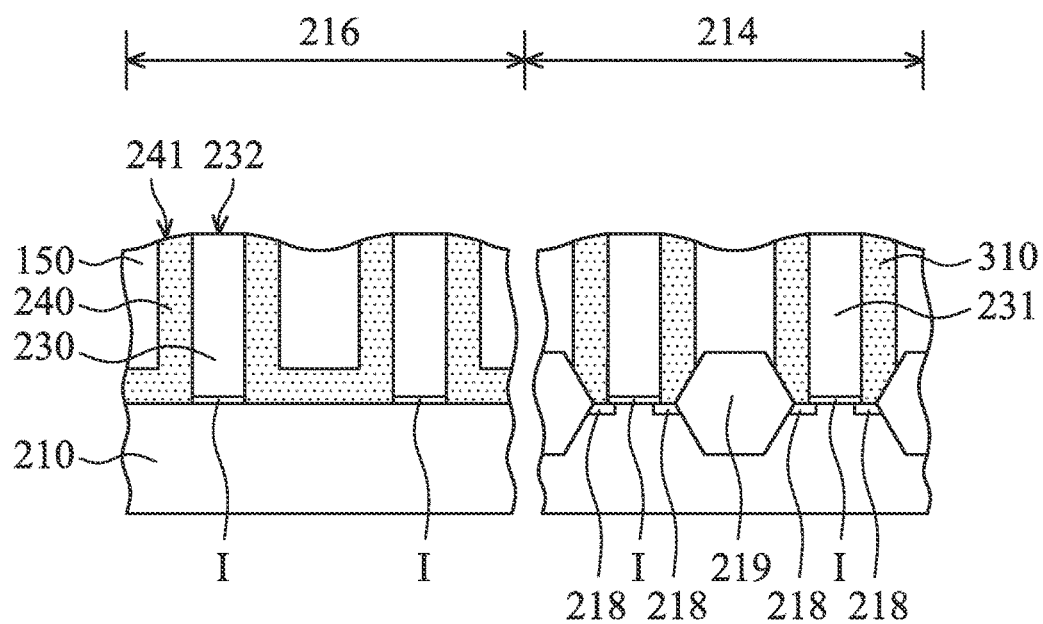

Thereafter, as shown in FIG. 6B, a top portion of the cover layer 150, the calibration material layer 240 over the top surfaces 232 of the strip structures 230, and the patterned mask layer 220 are removed, in accordance with some embodiments. After the removal process, the strip structures 230 are exposed.

Figure 6C:
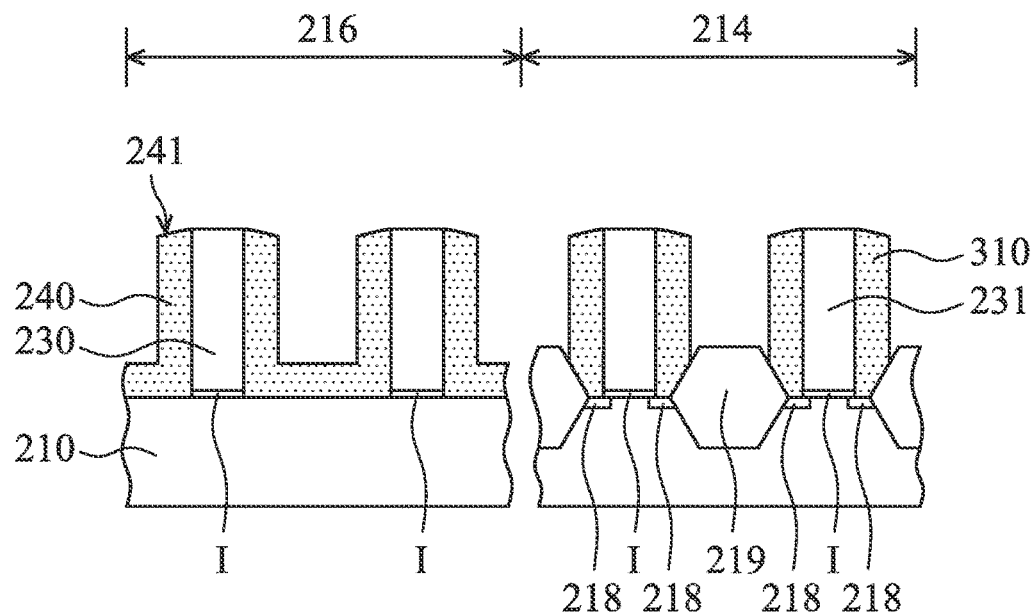

The removal process includes, for example, a dry etching process. The removal rates of the cover layer 150 and the calibration material layer 240 may be different due to that the cover layer 150 and the calibration material layer 240 are made of different materials. Therefore, a top surface 241 of the calibration material layer 240 is a curved surface, in accordance with some embodiments. Thereafter, as shown in FIG. 6C, the cover layer 150 is removed.

Figure 6D:
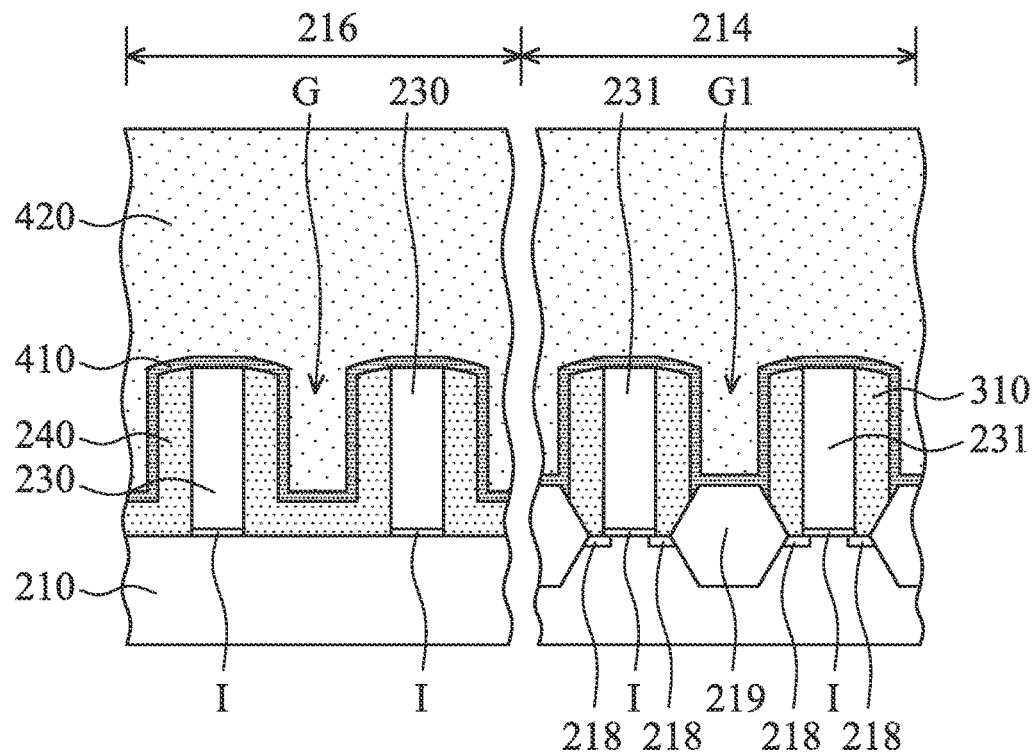

As shown in FIG. 6D, an etch stop layer 410 is deposited over the calibration material layer 240, the strip structures 230, the gates 231, and the spacer layer 310, in accordance with some embodiments. Thereafter, a filling layer 420 is formed over the calibration material layer 240, the strip structures 230, the gates 231, and the spacer layer 310 to fill gaps G between the strip structures 230 and gaps G1 between the gates 231, in accordance with some embodiments. In some embodiments, the filling layer 420 is formed over the etch stop layer 410.

Figure 6E:
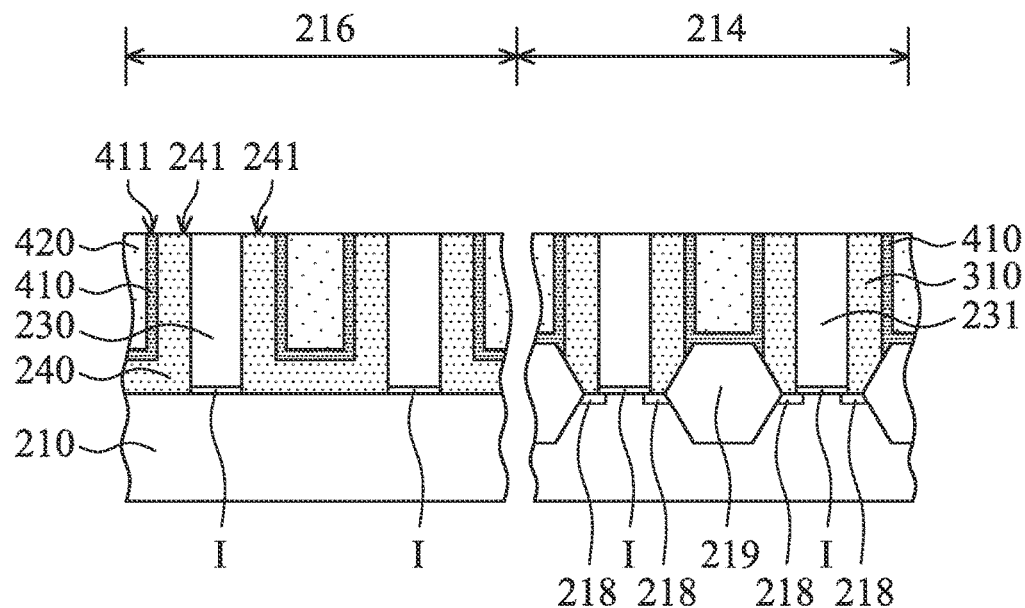

As shown in FIG. 6E, a planarization process is performed to remove a portion of the filling layer 420, top portions of the etch stop layer 410, top portions of the calibration material layer 240, and top portions of the strip structures 230, in accordance with some embodiments. The planarization process includes, for example, a chemical-mechanical polishing process.

After the planarization process, the top surface 241 of the calibration material layer 240 and the top surface 411 of the etch stop layer 410 both become planar surfaces, and the strip structures 230 and the gates 231 are exposed. In some embodiments, the top surface 411 of the etch stop layer 410 is coplanar with the top surface 241 of the calibration material layer 240.

Figure 6F:
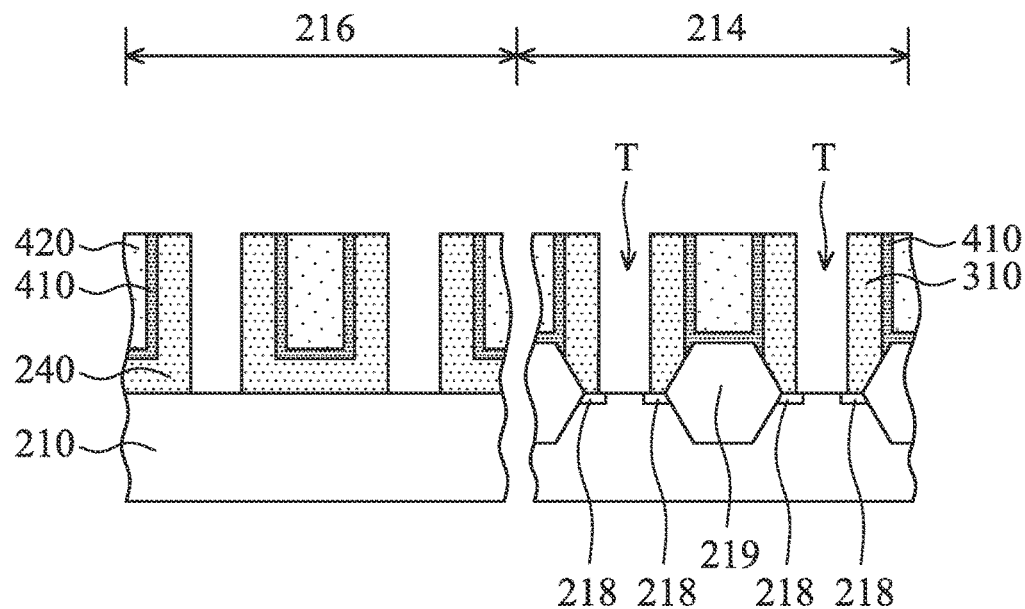
Figure 6G:
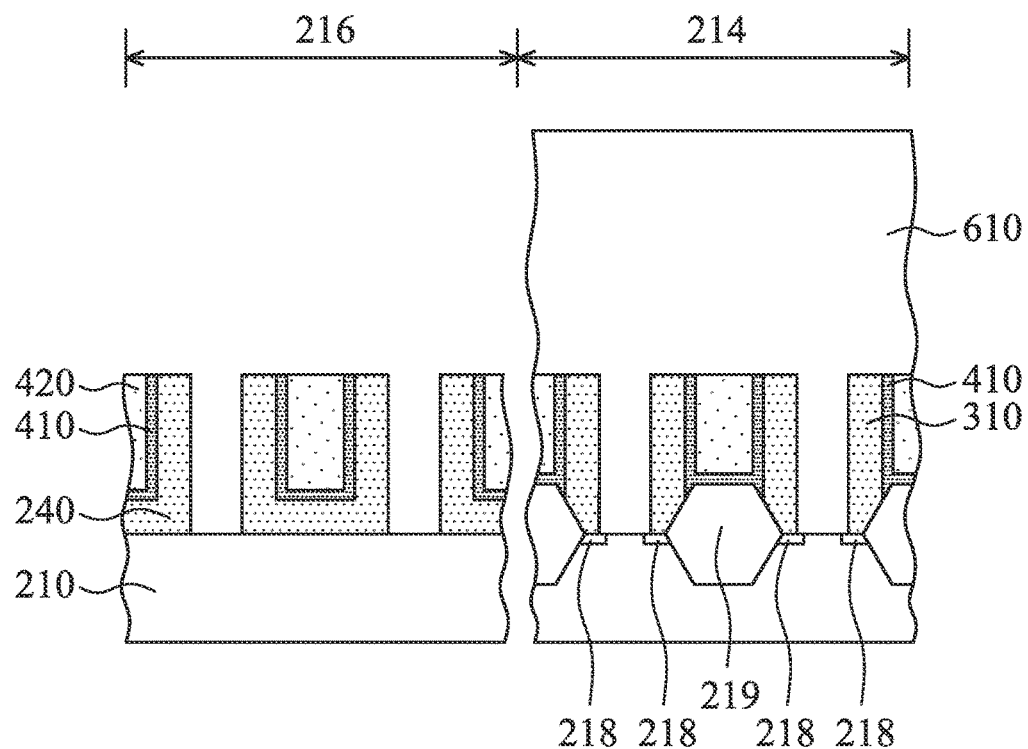

As shown in FIG. 6F, the strip structures 230 and the gates 231 are removed, in accordance with some embodiments. The removal process includes, for example, a dry etching process, a wet etching process, or a combination thereof. After the removal process, trenches T are formed in the spacer layer 310. As shown in FIG. 6G, a mask layer 610 is formed over the substrate 210 to cover the active region 214, in accordance with some embodiments. In some embodiments, the mask layer 610 includes a photoresist layer.

Figure 6H:
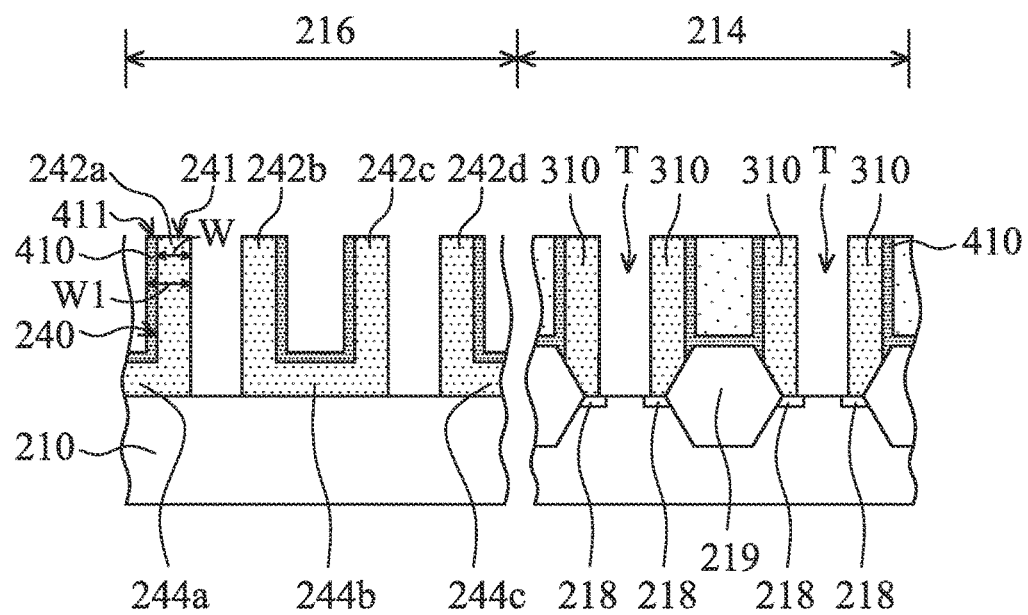

As shown in FIG. 6H, the filling layer 420 in the calibration region 216 is removed, in accordance with some embodiments. The removal process includes, for example, a wet etching process. Thereafter, the mask layer 610 is removed. The removal process includes a photoresist stripping process or another suitable removal process. In subsequent processes (not shown), gates (e.g., metal gates) may be formed in the trenches T.

The remaining calibration material layer 240 is substantially similar to the remaining calibration material layer 240 of FIG. 3F. It should be noted that after the planarization process, the top surface 241 of the calibration material layer 240 becomes a planar surface, which helps to improve the accuracy of the measured values of the line widths W of the linear calibration structures 242a, 242b, 242c, and 242d.

In some embodiments, after the planarization process, the top surface 411 of the etch stop layer 410 also becomes a planar surface, which helps to improve the accuracy of the measured value of a line width W1 of a linear structure constituted by the linear calibration structure 242a, 242b, 242c, or 242d and the etch stop layer 410.

In accordance with some embodiments, dimension measurement apparatus calibration standards and methods for forming the same are provided. The methods form a dimension measurement apparatus calibration standard by a deposition process, not by a photolithography process and an etching process. Therefore, the uniformity of the line widths of linear calibration structures of the dimension measurement apparatus calibration standard is not affected by the photolithography process and the etching process. As a result, the uniformity of the line widths of the linear calibration structures is improved, which benefits tool-to-tool matching and therefore improves the accuracy of the measured values of the critical dimensions of semiconductor devices.

In accordance with some embodiments, a method for forming a dimension measurement apparatus calibration standard over a substrate is provided. The method includes forming strip structures over the substrate. The method includes depositing a calibration material layer over the substrate and the strip structures. The calibration material layer and the strip structures are made of different materials. The method includes removing the calibration material layer over the top surfaces of the strip structures to expose the strip structures. The method includes removing the strip structures. The calibration material layer remaining over sidewalls of the strip structures forms linear calibration structures.

In accordance with some embodiments, a method for forming a dimension measurement apparatus calibration standard over a substrate is provided. The method includes forming strip structures over the substrate. The method includes depositing a calibration material layer over the substrate and the strip structures. The calibration material layer and the strip structures are made of different materials. The method includes removing the calibration material layer over first top surfaces of the strip structures. The method includes forming a filling layer over the calibration material layer and the strip structures to fill gaps between the strip structures. The method includes performing a planarization process to remove a portion of the filling layer, top portions of the calibration material layer, and top portions of the strip structures. The method includes removing the filling layer. The method includes removing the strip structures. The calibration material layer remaining over sidewalls of the strip structures forms linear calibration structures.

In accordance with some embodiments, a dimension measurement apparatus calibration standard over a substrate is provided. The dimension measurement apparatus calibration standard includes linear calibration structures disposed on the substrate. The linear calibration structures at least include a first linear calibration structure and a second linear calibration structure. The dimension measurement apparatus calibration standard includes a connection structure connecting the first linear calibration structure and the second linear calibration structure. The connection structure is thinner than the linear calibration structures, and the connection structure and the linear calibration structures are made of the same material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a dimension measurement apparatus calibration standard over a substrate, comprising:
    forming a plurality of strip structures over the substrate;
    depositing a calibration material layer over the substrate and the strip structures, wherein the calibration material layer and the strip structures are made of different materials;
    forming a cover layer over the calibration material layer, wherein the calibration material layer separates the cover layer from the strip structures;
    removing a top portion of the cover layer and a portion of the calibration material layer to expose top surfaces of the strip structures;

removing the cover layer; and after the removal of the cover layer, removing the strip structures, wherein the calibration material layer remaining over sidewalls of the strip structures forms a plurality of linear calibration structures.

2. The method for forming a dimension measurement apparatus calibration standard over a substrate as claimed in claim 1, wherein the depositing of the calibration material layer comprises performing a chemical vapor deposition process or a physical vapor deposition process.

3. The method for forming a dimension measurement apparatus calibration standard over a substrate as claimed in claim 1, wherein the cover layer and the strip structures are made of different materials.

4. The method for forming a dimension measurement apparatus calibration standard over a substrate as claimed in claim 1, wherein the depositing of the calibration material layer comprises:

conformally depositing the calibration material layer over the sidewalls of the strip structures.

5. The method for forming a dimension measurement apparatus calibration standard over a substrate as claimed in claim 1, further comprising:

before the deposition of the calibration material layer, forming a patterned mask layer over the top surfaces of the strip structures, wherein the calibration material layer is further deposited over the patterned mask layer, and the removal of the top portion of the cover layer and the portion of the calibration material layer further comprises:

removing the patterned mask layer, wherein the patterned mask layer and the strip structures are made of different materials.

6. The method for forming a dimension measurement apparatus calibration standard over a substrate as claimed in claim 1, wherein the removal of the top portion of the cover layer and the portion of the calibration material layer comprises:

performing a dry etching process.

7. The method for forming a dimension measurement apparatus calibration standard over a substrate as claimed in claim 1, wherein the substrate comprises a calibration region and an active region, and the forming of the strip structures comprises:

forming the strip structures in the calibration region.

8. The method for forming a dimension measurement apparatus calibration standard over a substrate as claimed in claim 7, further comprising:

forming a plurality of gates in the active region during the forming of the strip structures, wherein the calibration material layer is further deposited over the gates.

9. A method for forming a dimension measurement apparatus calibration standard over a substrate, comprising:

forming a plurality of strip structures over the substrate;

depositing a calibration material layer over the substrate and the strip structures, wherein the calibration material layer and the strip structures are made of different materials;

forming a cover layer over the calibration material layer, wherein the calibration material layer separates the cover layer from the strip structures;

removing a top portion of the cover layer and the calibration material layer over first top surfaces of the strip structures;

removing the cover layer;

forming a filling layer over the calibration material layer and the strip structures to fill gaps between the strip structures;

performing a planarization process to remove a portion of the filling layer, top portions of the calibration material layer, and top portions of the strip structures;

removing the filling layer; and after the removal of the cover layer and the filling layer, removing the strip structures, wherein the calibration material layer remaining over sidewalls of the strip structures forms a plurality of linear calibration structures.

10. The method for forming a dimension measurement apparatus calibration standard over a substrate as claimed in claim 9, further comprising:

after the removal of the calibration material layer over the first top surfaces and before the forming of the filling layer, forming an etching stop layer over the calibration material layer and the strip structures, wherein the planarization process further removes a portion of the etching stop layer, and the etching stop layer comprises nitrides.

11. The method for forming a dimension measurement apparatus calibration standard over a substrate as claimed in claim 9, wherein the planarization process comprises a chemical-mechanical polishing process.

12. The method for forming a dimension measurement apparatus calibration standard over a substrate as claimed in claim 9, wherein the depositing of the calibration material layer comprises performing a chemical vapor deposition process or a physical vapor deposition process.

13. The method for forming a dimension measurement apparatus calibration standard over a substrate as claimed in claim 12, wherein the depositing of the calibration material layer comprises an atomic layer deposition process, a plasma enhanced atomic layer deposition process, a low-pressure chemical vapor deposition process, a plasma enhanced chemical vapor deposition process, or a hybrid physical-chemical vapor deposition process.

14. The method for forming a dimension measurement apparatus calibration standard over a substrate as claimed in claim 9, further comprising:

before the deposition of the calibration material layer, forming a patterned mask layer over the first top surfaces of the strip structures, wherein the calibration material layer is further deposited over the patterned mask layer, and the removal of the top portion of the cover layer and the calibration material layer over the first top surfaces of the strip structures further comprises:

removing the patterned mask layer, wherein the patterned mask layer and the strip structures are made of different materials.

15. The method for forming a dimension measurement apparatus calibration standard over a substrate as claimed in claim 14, wherein the removal of the portion of the cover layer and the calibration material layer over the first top surfaces comprises:

performing a dry etching process.

16. A method for forming a dimension measurement apparatus calibration standard over a substrate, comprising:

forming a plurality of strip structures over the substrate;

conformally depositing a calibration material layer over the substrate and the strip structures, wherein the calibration material layer and the strip structures are made of different materials;

forming a cover layer over the calibration material layer, wherein the calibration material layer separates the cover layer from the strip structures;

performing a dry etching process to remove a top portion of the cover layer and a portion of the calibration material layer so as to expose top surfaces of the strip structures;

removing the cover layer; and after the removal of the cover layer, removing the strip structures, wherein the calibration material layer remaining over sidewalls of the strip structures forms a plurality of linear calibration structures.

17. The method for forming a dimension measurement apparatus calibration standard over a substrate as claimed in claim 16, wherein the dry etching process further removes portions of the strip structures.

18. The method for forming a dimension measurement apparatus calibration standard over a substrate as claimed in claim 16, further comprising:

before the deposition of the calibration material layer, forming a patterned mask layer over the top surfaces of the strip structures, wherein the calibration material layer is further deposited over the patterned mask layer, and the removal of the top portion of the cover layer and the portion of the calibration material layer further comprises:

removing the patterned mask layer, wherein the patterned mask layer and the strip structures are made of different materials.

19. The method for forming a dimension measurement apparatus calibration standard over a substrate as claimed in claim 16, wherein the conformally depositing of the calibration material layer comprises performing a chemical vapor deposition process or a physical vapor deposition process.

20. The method for forming a dimension measurement apparatus calibration standard over a substrate as claimed in claim 19, wherein the conformally depositing of the calibration material layer comprises performing an atomic layer deposition process, a plasma enhanced atomic layer deposition process, a low-pressure chemical vapor deposition process, a plasma enhanced chemical vapor deposition process, or a hybrid physical-chemical vapor deposition process.

* * * * *